United States Patent
Levardo et al.

(10) Patent No.: US 11,728,309 B2
(45) Date of Patent: Aug. 15, 2023

(54) CLIP HAVING LOCKING RECESS FOR CONNECTING AN ELECTRONIC COMPONENT WITH A CARRIER IN A PACKAGE

(71) Applicant: Infineon Technologies AG, Neubiberg (DE)

(72) Inventors: Melvin Levardo, Carmona (PH); Ryan Ross Agbay Alinea, Las Pinas (PH); Markus Dinkel, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 60 days.

(21) Appl. No.: 16/875,258

(22) Filed: May 15, 2020

(65) Prior Publication Data
US 2020/0365549 A1    Nov. 19, 2020

(30) Foreign Application Priority Data
May 16, 2019    (DE) .................. 10 2019 112 979.6

(51) Int. Cl.
*H01L 23/00*    (2006.01)
(52) U.S. Cl.
CPC .............. *H01L 24/72* (2013.01); *H01L 24/73* (2013.01)
(58) Field of Classification Search
CPC ...................................................... H01L 24/72
USPC ......................................................... 257/727
See application file for complete search history.

(56) References Cited

U.S. PATENT DOCUMENTS

| | | |
|---|---|---|
| 2004/0262781 A1 | 12/2004 | St. Germain et al. |
| 2006/0108673 A1 | 5/2006 | St. Germain et al. |
| 2009/0250794 A1 | 10/2009 | St. Germain et al. |
| 2009/0294932 A1 | 12/2009 | Sahasrabudhe et al. |
| 2010/0314743 A1* | 12/2010 | Li ................ H01L 23/4334 257/690 |
| 2012/0133037 A1* | 5/2012 | Cruz .................. H01L 24/35 257/676 |
| 2017/0207150 A1* | 7/2017 | Choi ............... H01L 23/49562 |

FOREIGN PATENT DOCUMENTS

| | | | |
|---|---|---|---|
| CN | 206584912 U | * 10/2017 | ....... H01L 23/49575 |
| DE | 102007049481 A1 | 4/2008 | |
| JP | H0477261 U | 7/1992 | |
| JP | H0567722 A | 3/1993 | |
| JP | 2015072991 A | 4/2015 | |
| KR | 20170012927 A | 2/2017 | |

* cited by examiner

*Primary Examiner* — Ajay Arora
(74) *Attorney, Agent, or Firm* — Murphy, Bilak & Homiller, PLLC

(57) ABSTRACT

A clip for connecting an electronic component with a carrier in a package is provided. The clip includes a clip body having a component connection portion configured to be connected with the electronic component to be mounted on the carrier, and a carrier connection portion configured to be connected with the carrier. The clip further includes at least one locking recess in a surface portion of the clip body, the surface portion being configured to face the carrier. The at least one locking recess is configured to accommodate material of an encapsulant of the package so as to lock the encapsulant and the clip. A corresponding method of manufacturing the package is also provided.

21 Claims, 4 Drawing Sheets

CLIP HAVING LOCKING RECESS FOR CONNECTING AN ELECTRONIC COMPONENT WITH A CARRIER IN A PACKAGE

TECHNICAL FIELD

The present invention relates to a clip, a package, and a method of manufacturing a package.

BACKGROUND

A package may comprise an electronic component, such as a semiconductor chip, mounted on a carrier, such as a leadframe. Packages may be embodied as encapsulated electronic component mounted on a carrier with electrical connects extending out of the encapsulant and being coupled with an electronic periphery. In a package, the electronic component may be connected to the carrier by a clip or a bond wire.

However, delamination of the constituents of a package may deteriorate mechanical and electrical reliability of the package.

SUMMARY

There may be a need to manufacture a package having a high reliability.

According to an exemplary embodiment, a clip for connecting an electronic component with a carrier in a package is provided, the clip comprising a clip body having a component connection portion configured for being connected with the electronic component to be mounted on the carrier, and a carrier connection portion configured for being connected with the carrier, wherein the clip further comprises at least one locking recess in a surface portion of the clip body, which surface portion is configured for facing the carrier, and wherein the at least one locking recess is configured for accommodating material of an encapsulant of the package to thereby lock the encapsulant and the clip.

According to another exemplary embodiment, a package is provided which comprises a clip for connecting an electronic component with a carrier and having at least one locking recess, and an encapsulant partially encapsulating the clip so that the clip remains partially exposed with regard to the encapsulant, wherein material of the encapsulant is accommodated in the at least one locking recess to thereby lock the encapsulant and the clip.

According to yet another exemplary embodiment, a method of manufacturing a package is provided, wherein the method comprises connecting an electronic component with a carrier by a clip having at least one locking recess, partially encapsulating the clip by an encapsulant so that at least part of a main surface of the clip remains partially exposed with regard to the encapsulant, and locking the encapsulant and the clip by accommodating material of the encapsulant in the at least one locking recess.

According to an exemplary embodiment, a clip is provided which has one or more locking recesses configured for locking encapsulant material when the clip is assembled for connecting an electronic component with a carrier and when the encapsulant is formed to surround at least part of the electronic component and the carrier as well as the clip. By triggering a mechanical locking between encapsulant material, such as a mold compound, and the clip functioning as carrier-component-interconnect, mechanical integrity of the package may be enhanced and undesired delamination between clip and encapsulant may be inhibited. Furthermore, by promoting a mechanical interlock between clip and encapsulant thanks to the one or more locking recesses, also the electric reliability of the package may be improved, since a delamination caused intrusion of humidity or the like into the package may be securely prevented.

Advantageously, one or more locking recesses of the clip may also function as solder stop limiting flow of solder material which may be used for establishing connections within the package, for instance between carrier and electronic component and/or between electronic component and clip. As a result, flow of solder in undesired regions of the package can be strongly suppressed.

Surprisingly it has turned out that especially configuring a surface portion of the clip with the at least one locking recess, which surface portion faces towards the carrier, is particularly efficient for promoting intra-package adhesion between the package constituents. Advantageously, at least a portion of an upper main surface of the clip (for instance a surface portion opposing the above-mentioned surface portion facing carrier and electronic component in the readily manufactured package) may be exposed with respect to the encapsulant to thereby contribute to heat removal out of an interior of the package.

In the following, further exemplary embodiments of the clip, the package and the method will be explained.

In the context of the present application, the term "clip" may particularly denote a three-dimensionally curved connection element which comprises an electrically conductive material (such as copper) and which may be an integral body with sections to be connected to one or more electronic component terminals and to the carrier. In particular, such a clip may have two sections to be connected to an upper main surface of the respective electronic component and an upper main surface of the carrier, wherein the two mentioned sections are interconnected, for instance by a slanted, stepped or vertical connection section.

In the context of the present application, the term "package" may particularly denote an electronic device which may comprise one or more electronic components mounted on a carrier. Optionally, at least part of the constituents of the package may be encapsulated at least partially by an encapsulant. Further optionally, one or more electrically conductive interconnect bodies (such as bond wires and/or clips) may be implemented in a package, for instance for electrically coupling the electronic component with the carrier.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "encapsulant" may particularly denote a substantially electrically insulating and preferably thermally conductive material surrounding an electronic component and optionally part of a carrier and/or a clip to provide mechanical protection, electrical insulation, and optionally a contribution to heat removal during operation.

In the context of the present application, the term "locking recess" may particularly denote a blind hole (such as a groove or a dimple or a channel), through hole and/or notch extending from a surface of the clip inwardly so that uncured encapsulant material (for instance liquid or viscous mold compound) may flow into the locking recess. After curing or solidification of the previously uncured encapsulant material, the respective locking recess may then remain permanently filled with cured or solidified encapsulant material to thereby accomplish a mechanical interlocking between clip and encapsulant.

A gist of an exemplary embodiment is the provision of a clip mold lock design obtained by a cooperation of at least one locking recess formed in the clip and mold or other encapsulant material. Descriptively speaking, locking recess and encapsulant material may establish a mutual form closure holding clip and encapsulant together. More specifically, an exemplary embodiment may provide a grooved clip mold lock design to avoid delamination between mold compound and clip surface along an oblong interlocking region. Synergistically, the at least one locking recess of the clip may also act as a solder stop. Exemplary embodiments may be particularly advantageous for dual sided cool clip packages.

In an embodiment, the clip may be configured for electrically coupling an upper main surface of an electronic component (for instance a semiconductor chip) with an upper main surface of a carrier (for instance a leadframe). A component connection portion of the clip may be a clip body portion configured for being connected with the upper main surface of the electronic component when a lower main surface of the electronic component is mounted (with or without being electrically coupled with the carrier) on the upper main surface of the carrier. A carrier connection portion of the clip may be a clip body portion configured for being connected with the upper main surface of the carrier. The component connection portion and the carrier connection portion may be mechanically and electrically coupled with each other, for instance may both form part of an integral electrically conductive clip body. At least one locking recess of the clip may be formed in a lower main surface portion of the clip body facing the carrier when the electronic component is mounted on the carrier and the clip connects the carrier with the component. Additionally or alternatively, at least one locking recess of the clip may be formed in an upper main surface portion of the clip body opposing the carrier when the electronic component is mounted on the carrier and the clip connects the carrier with the component. The component connection portion and the carrier connection portion may be at different vertical levels to thereby bridge a height difference (due to the thickness of the electronic component) between the upper main surface of the for instance planar carrier and the upper main surface of the electronic component mounted on the carrier.

In an embodiment, the package comprises a plurality of electronic components mounted on the carrier and/or connected by the clip. Thus, the package may comprise one or more electronic components (for instance at least one passive component, such as a capacitor, and at least one active component, such as a semiconductor chip). Correspondingly, it is also possible that the package comprises a plurality of clips, wherein all or part of these clips may be provided with one or more locking recess, having the features as described herein.

In an embodiment, the clip body comprises or consists of an electrically conductive material, in particular at least one metal, more particularly at least one of copper and aluminum. Thus, the electrically conductive clip body may contribute to the transmission of electric signals and electric power during operation of the package. For instance, an electric current may flow from the electronic component, via the clip to the carrier, or in opposite direction. Optionally, at least part of the component connection portion and/or at least part of the carrier connection portion of the clip body may be provided with a connection medium such as a solder for simplifying connection with carrier and/or electronic component.

In an embodiment, the clip body is entirely made of a homogeneous material. By taking this measure, manufacture of clip and package may be simplified, since only a single homogeneous material (such as copper and/or aluminum) may be sufficient for forming the clip body. For instance, microscopic surface roughening of the clip body may be carried out for further improving adhesion with encapsulant material and for synergistically cooperating with the locking effect of the at least one macroscopic locking recess. The provision of a separate material (such as a morphological adhesion promoter) for surface roughening may be dispensable in one embodiment, but may be implemented in addition to the formation of the at least one locking recess in other embodiments.

Advantageously, interlocking encapsulant and clip by one or more locking recesses according to an exemplary embodiment is an approach which is not limited by any constraint which may have to be considered with adhesion promoters as a result of the fact that the carrier may be covered temporarily by a tape at the bottom side during manufacture. When a clip bottom surface is covered by a tape at the bottom side, chemical dispensing of adhesion promoters may be restricted. In contrast to such conventional approaches, the provision of one or more locking recesses according to an exemplary embodiment does not leave a corresponding surface at any risk of weak adhesion interface.

In an embodiment, the at least one locking recess has an undercut. Such an undercut may be denoted as locking recess shaped for being inaccessible using a straight body. As a result, encapsulant material flowing into such an undercut type locking recess and solidifying thereafter may provide a specifically robust interlocking between clip and encapsulant, thereby significantly improving intra-package adhesion. Formation of an undercut may also be the basis for creating specifically stable connection geometries between clip and encapsulant, for instance a dovetail type connection.

In an embodiment, at least one of the group consisting of the at least one locking recess, and material of the clip body between two adjacent locking recesses has a dovetail shape. A dovetail joint may be established by cooperation of a flaring stud and an inverse shaped channel into which the flaring stud fits tightly making an interlocking joint between said two pieces that resists pulling apart. Thus, the formation of a dovetail shaped joint between locking recess and encapsulant protrusion may provide a particularly pronounced protection against delamination.

In an embodiment, the at least one locking recess is formed as at least one locking blind hole, in particular at least one locking groove. The formation of a blind hole type locking recess is advantageous, since it removes only a small amount of clip material and thus allows maintaining a high current flow capability and a high thermal performance. In other words, a blind hole type locking recess removes only a very small amount of material of the clip for recess formation. As a consequence, high mechanical density remains in the clip so that a high amount of clip material transporting current and/or heat remains. When a locking recess is configured as blind hole, it may be particularly preferred that such a blind hole is shaped as a groove. In this context, a groove may be a long (in particular straight), narrow cut or indentation in the clip surface, i.e. a furrow shaped recess. Hence, such a groove may be capable of accommodating a relatively large amount of encapsulation material, to thereby establish a strong form closure between clip and encapsulant. This may improve mechanical integrity of the package as a whole.

However, it is—additionally or alternatively—also possible that one or more through holes are created in the clip as one or more locking recesses, for particularly efficiently enhancing interlocking.

In an embodiment, the at least one locking recess is formed as a recess array of a central recess between two lateral recesses. This geometry has turned out as highly appropriate for providing a pronounced adhesion between clip and encapsulant. In particular, a recess array of three parallel extending grooves provides excellent results in terms of delamination suppression.

In particular, the central recess may be wider than the two narrower lateral recesses. It has turned out to be advantageous in terms of adhesion promotion if the macroscopic central recess has a larger recess volume than the still macroscopic, but smaller volume lateral recesses.

For instance, the central recess has at least a partial section with tapering side walls. In contrast to this, the two lateral recesses may have straight side walls. More specifically, when providing at least part of said grooves with at least partially tapering sidewalls, specifically robust undercut type grooves may be created, and preferably dovetail shaped grooves and/or dovetail shaped clip material in between.

In an embodiment, the clip comprises multiple sets of locking recesses, each assigned to a corresponding dimension of an electronic component to be connected by the clip. By taking this measure and providing different sets of locking recesses, a universal clip may be created which is compatible with electronic components (in particular semiconductor chips) of different dimensions. For instance, each of the sets of locking recesses may be arranged so that it stays uncovered by a corresponding electronic component, when the clip is mounted as a bridge for connecting carrier and a top main surface of the electronic component. Thus, one in the same chip may be pre-designed to be used, without modification or specific adaptation, with multiple different chip types and chip dimensions.

In an embodiment, a depth and/or a width of the at least one locking recess is in the range between 20 μm and 200 μm, in particular in the range between 40 μm and 100 μm. It has turned out that corresponding macroscopic locking recesses with properly defined shape and dimension are particularly appropriate for receiving a sufficient amount of encapsulant material for a significant improvement of intra-package connection forces. Surprisingly, such macroscopic locking recesses allow to significantly improve the adhesion between clip and mold compound.

Optionally, said macroscopic locking recesses may be synergistically combined with a microscopic roughening of at least a part of the clip surface. By such a microscopic roughening for adhesion promotion, a random structure of micro-protrusions may be formed usually having dimensions below 1 μm.

In an embodiment, a thickness of the clip body is in a range between 200 μm and 1 mm, in particular in the range between 300 μm and 500 μm. For instance, a copper clip body may have a thickness of 385 μm.

In an embodiment, at least one of the at least one locking recess is formed in a surface portion of the clip body to face towards the carrier. Thus, it may be preferred to form one or more locking recesses in a bottom surface of the clip body. As a result, said one or more locking recesses may be positioned on the same main surface of the clip at which the clip connects the electronic component and the carrier. Said main surface as a position for the one or more locking recesses has turned out as particularly appropriate for strongly improving intra-package adhesion due to an interlocking between mold compound and locking recesses.

In an embodiment, at least one of the at least one locking recess is formed in a surface portion of the clip body facing away from or opposing the carrier. Thus, also an upper main surface of the clip (facing away from or opposing carrier and electronic component) may be equipped with one or more locking recesses. Such an upper main surface of the clip may have an encapsulated portion encapsulated with encapsulant and an exposed portion being exposed with regard to the encapsulant for promoting heat removal. Said encapsulated portion may be equipped with said at least one further locking recess and may thus also be at least partially filled with encapsulant material to further promote interlocking between clip and encapsulant. Also said one or more locking recesses may be at least partially filled with encapsulant material (in particular a mold compound) in a readily manufactured package. By taking this measure, any tendency of delamination within the package may be further suppressed.

In an embodiment, the package comprises a carrier on which the at least one electronic component is mounted, being partially encapsulated by the encapsulant and being connected with a carrier connection portion of the clip. In the context of the present application, the term "carrier" may particularly denote a support structure (preferably, but not necessarily electrically conductive) which serves as a mechanical support for the one or more electronic components, and which may also contribute to the electric interconnection between the electronic component(s) and the periphery of the package. In other words, the carrier may fulfil a mechanical support function and an electric connection function.

In an embodiment, the carrier comprises a leadframe, in particular comprising a die pad and a plurality of leads. Such a leadframe may be a sheet-like metallic structure which can be patterned so as to form one or more die pads or mounting sections for mounting the one or more electronic components of the package, and one or more lead sections for an electric connection of the package to an electronic environment when the electronic component(s) is/are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically advantageous configuration in which a low ohmic connection of the at least one electronic component can be combined with a robust support capability of the leadframe. Furthermore, a leadframe may contribute to the thermal conductivity of the package and may remove heat generated during operation of the electronic component(s) as a result of the high thermal conductivity of the metallic (in particular copper) material of the leadframe. A leadframe may comprise for instance aluminum and/or copper. In the context of the present application, the term "die pad" may particularly denote a portion of a leadframe being shaped and dimensioned for accommodating an electronic component such as a semiconductor chip. Correspondingly, the surface area of the die pad is usually flat and planar and sufficiently large for fully receiving the chip or die thereon. In contrast to this, the term "leads" may particularly denote another portion of a leadframe which may at least partially extend beyond an encapsulant (if present) and serves as connection element to an electronic periphery of the package. It is for instance possible that one or more terminals of the electronic component mounted on the die pad is or are electrically connected to a respective one of the leads, for instance by a clip, bond wire or bond ribbon. It is for instance possible that the die pad is encapsulated and the leads are partially or entirely exposed with regard to an encapsulant. It is also possible that the die pad forms a central portion of a leadframe type carrier, whereas the leads may form a peripheral portion of the leadframe. Both die pads and leads may at least partially comprise a metallic material. More generally, the carrier may be a partially or entirely metallic structure.

In another embodiment, the carrier comprises at least one of the group consisting of a ceramic substrate, a stack composed of a central electrically insulating and thermally conductive layer (such as a ceramic layer) covered on both opposing main surfaces by a respective electrically conductive layer (such as a copper layer or an aluminum layer, wherein the respective electrically conductive layer may be a continuous or a patterned layer), a Direct Copper Bonding (DCB) substrate, and a Direct Aluminum Bonding (DAB) substrate.

In an embodiment, a connection between the electronic component and the carrier, a connection between the electronic component and the clip, and/or a connection between the carrier and the clip is formed by a connection medium. Said connection medium may be partially accommodated in the at least one locking recess, so that the at least one locking recess may simultaneously function as a stop structure for preventing connection medium from flowing into undesired regions of the package. For instance, the connection medium may be a solder structure, a sinter structure, a welding structure, and/or a glue structure. Thus, mounting the electronic component on the carrier may be accomplished by soldering, sintering or welding, or by adhering or gluing.

In an embodiment, the encapsulant can be, for example, a mold compound. When encapsulating by molding, injection molding or transfer molding may be carried out, for example. Hence, the encapsulant may comprise a mold, in particular a plastic mold. For instance, a correspondingly encapsulated body (in particular electronic component with carrier) may be provided by placing the body or bodies between an upper mold tool and a lower mold tool and to inject liquid mold material therein. After solidification of the mold material, formation of the encapsulant is completed. If desired, the mold may be filled with particles improving its properties, for instance its heat removal properties. In other exemplary embodiments, the encapsulant may also be a casting component.

In an embodiment, the at least one locking recess is formed by punching or etching. However, forming the locking recess may more generally comprise at least one of the group consisting of embossing, stamping, etching, laser processing, patterning, etc. Thus, many different manufacturing procedures being properly compatible with package manufacturing may be used for forming the at least one locking recess. It may be preferred to select a manufacturing method for forming the at least one locking recess which allows obtaining a locking recess with undercut, if desired.

In an embodiment, the package comprises, in addition to the clip, at least one further electrically conductive connection structure electrically connecting the mounted electronic component(s) with the carrier. For instance, the electrically conductive connection structure may comprise at least one of the group consisting of a further clip, a wire bond, and a ribbon bond. In particular, it is possible to use a wire bond or ribbon bond which is a flexible electrically conductive wire or ribbon shaped body having one end portion connected to the upper main surface of the respective electronic component and having an opposing other end portion being electrically connected to the carrier.

In an embodiment, the package is configured for double-sided cooling (for instance by exposing thermally conductive surfaces of one or more carriers and/or one or more clips at both opposing main surfaces of the package). By double-sided cooling it is meant that heat generated during operation of the package can be dissipated from the package via both opposing main surfaces thereof. Such a double-sided cooling architecture, which is particularly appropriate for power semiconductor applications, is perfectly compatible with the encapsulant locking clip architecture according to an exemplary embodiment.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor), at least one diode, etc. In particular, circuits fulfilling a half-bridge function, a full-bridge function, etc., may be manufactured.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings.

DETAILED DESCRIPTION

Figure 1:
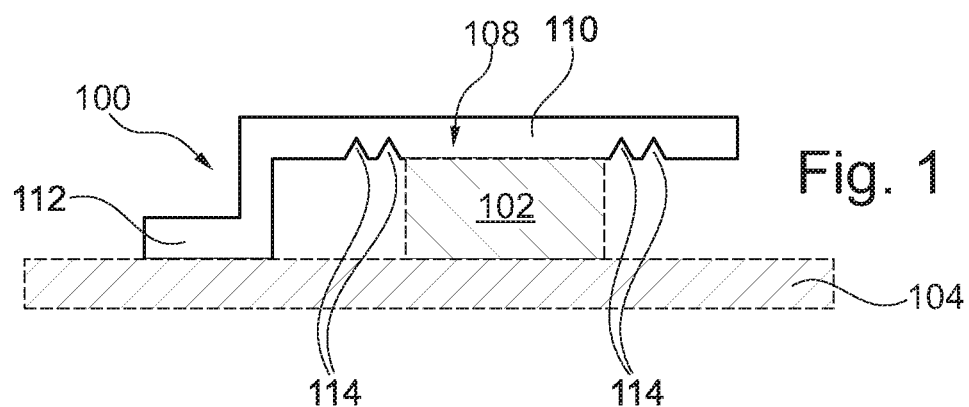
FIG. 1 illustrates a cross-sectional view of a clip according to an exemplary embodiment.

The illustration in the drawing is schematically and not to scale.

Before exemplary embodiments will be described in more detail referring to the Figures, some general considerations will be summarized based on which exemplary embodiments have been developed.

According to an exemplary embodiment, an encapsulant looking clip design (in particular a grooved clip mold lock design) is provided in form of at least one locking recess in a clip surface to avoid delamination between an encapsulant (such as a mold compound) and a clip surface. Simultaneously, at least one locking recess in a clip surface may act as a solder stop for preventing flow of solder into undesired regions of a package. In particular, such a solder stop feature may be advantageous for dual side cool clip packages. For instance, a clip (preferably comprising or consisting of copper) according to an exemplary embodiment may be configured for promoting a clip-mold locking.

More specifically, undesired clip bottom delamination of a copper clip in a molded package may be significantly suppressed and in particular even eliminated when providing preferably the bottom surface of the clip with one or more locking recesses for accomplishing an interlocking with mold material. Especially for dual side cool clip packages, clip bottom delamination has turned out as critical to further propagate to the outside of the package and even on the inside which may lead to internal breaking of the adhesive itself. By providing one or more locking recesses at a clip surface (in particular at a clip surface being oriented towards electronic component and carrier in the readily manufactured package) may efficiently prevent moisture or humidity to easily reach the top of the electronic component (in particular a semiconductor chip). Moreover, clip solder attach can be efficiently prevented from degrading due to the provision of one or more locking recesses.

Conventionally, certain factors may be considered for strengthening mechanical integrity of the package: On the one hand, clip surface roughness may be adjusted to suppress delamination. On the other hand, an implemented mold material may be selected with superior adhesion strength, high package resistance to stress, etc. Such conventional optimization strategies may be effective relative to package construction complexity and stress. However, in many design scenarios of packages, there is only a very limited freedom of selection of compounds, for instance due to risk of copper migration on wafers with copper pad metallization. Finding a proper match may take time and may involve high efforts, especially if a mold compound is unique or with given formulation. Even higher risk for delamination may occur with the mentioned conventional approaches in particular due to additional processes which need to be considered for dual side cool clip packages.

According to an exemplary embodiment, a clip (in particular a clip bottom) locking recess (preferably a locking groove) may be designed for suppressing delamination and improving infra-package adhesion. More specifically, such at least one locking recess may be provided with a dovetail shape feature further enhancing a mechanical mold locking function to hold mold compound in place and prevent it from detaching from the clip surface even with varying degree of surface roughness. Although it may be preferred to use a clip according to an exemplary embodiment with at least one locking recess in combination with a mold compound, other encapsulant materials may be used in other embodiments. Descriptively speaking, the encapsulant material (in particular mold material) may fill the preferably groove-type locking recess and may anchor itself inside the locking reverse, preferably with dovetail design. Upon curing the encapsulant material, the cooperation between the cured encapsulant (in particular solidified mold compound) and clip with locking recess mechanically holds the clip-encapsulant-arrangement in place even during temperature exchange.

In addition to its encapsulant-interlocking (in particular mold-locking) function, a locking groove edge may also work as mitigation for solder over bleed or flow. The edge may create a significant surface tension effect for solder to be contained within that area.

For instance, the at least one locking recess, preferably embodied as at least one locking groove, can be a series of punched or etched recesses creating a locking mechanism, can be a single groove, or at least one groove on top and/or bottom of the clip. For instance, the at least one locking recess (in particular embodied as groove) can be formed by a square punch or a tri-angular punch. The dimensions of the at least one locking recess as well as distances between adjacent locking recesses may be selected in accordance with the requirements of a specific application.

In an embodiment, a clip with at least one locking recess may be implemented in any desired package, preferably in a dual side cooling package, and most preferably in an SSO8 Dual Side Cool package. Investigations have encountered almost zero delamination tendency in packages having one or more clips with at least one locking recess. In particular by implementation of a clip groove, delamination performance may be improved significantly. In experimental tests, it has been demonstrated that no delamination occurs in a package with clip having locking recesses even after 2000 stress events.

According to an exemplary embodiment, a lead package may be provided having a discrete single die with exposed copper clip. In particular, such a package may employ a universal clip design for multiple different sizes of electronic components. This can be accomplished in particular by configuring the clip with a set of locking recesses, wherein each set may be specifically adapted (in particular dimensioned and positioned) for a corresponding size of an electronic component, such as a chip. The geometry and density of metal on the clip may be designed to meet demanding thermal performance. These advantages can be accomplished with a package according to an exemplary embodiment to be versatile as dual side cooling package with high reliability.

In another embodiment, the at least one locking recess may be configured as one or more through holes. In such an approach, care should be taken that the current carrying capability remains sufficiently high, that metal density is kept sufficiently large and that a sufficient thermal performance can be achieved.

FIG. 1 illustrates a cross-sectional view of a clip 100 according to an exemplary embodiment. Clip 100 is illustrated in FIG. 1 with other constituents of a package 106 as the one shown in FIG. 2A, for the sake of clarity.

Figure 2A:
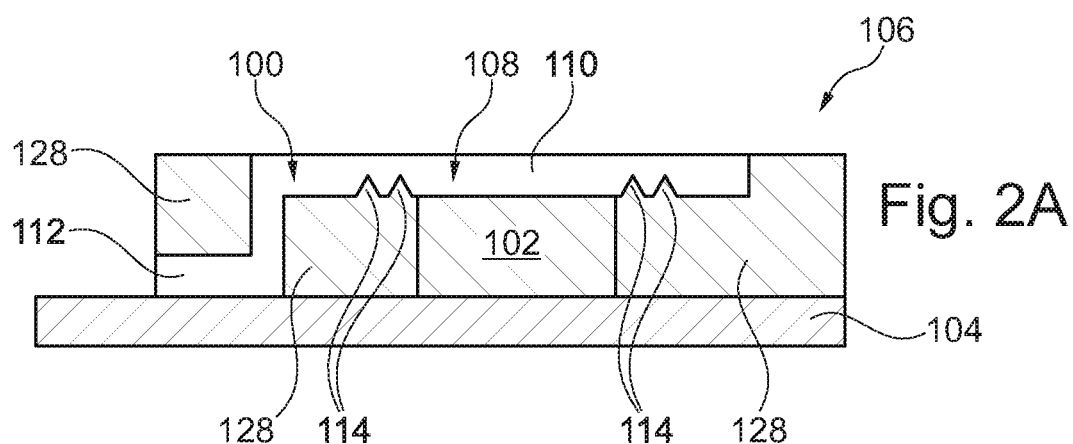
FIG. 2A illustrates a cross-sectional view of a package according to an exemplary embodiment.

The illustrated clip 100 is configured for connecting an electronic component 102 with a carrier 104 in a package 106 (compare FIG. 2A). The illustrated clip 100 comprises a clip body 108 having a component connection portion 110 configured for connecting the electronic component 102 when mounted on the carrier 104. Moreover, clip 100 comprises a carrier connection portion 112 connected with component connection portion 110 and configured for connecting the carrier 104. Advantageously, the clip 100 further comprises locking recesses 114 in a surface portion of the clip body 108 facing towards the carrier 104. The locking recesses 114 are configured for accommodating material of an encapsulant (compare reference numeral 128 in FIG. 2A) of the package 106 to thereby lock the encapsulant 128 and the clip 100.

FIG. 2A illustrates a cross-sectional view of a package 106 according to an exemplary embodiment.

The illustrated package 106 comprises clip 100 for connecting electronic component 102 with carrier 104. As shown, clip 100 comprises a plurality of locking recesses 114. An encapsulant 128 partially encapsulates the clip 100 so that the clip 100 remains partially exposed with regard to the encapsulant 128 on a top main surface of the clip 100. As shown in FIG. 2A, the top main surface of the clip 100 may be on the same level as a top surface of the encapsulant 128. Moreover, material of the encapsulant 128 is accommodated in the locking recesses 114 to thereby lock the encapsulant 128 and the clip 100.

As can be taken from FIG. 2A, an exposed upper main surface of the clip body 108 is positioned at the same vertical level as an upper main surface of the encapsulant 128. However, alternatively, the upper main surfaces of the clip body 108 and of the encapsulant 128 may also be at different vertical levels.

Figure 2B:
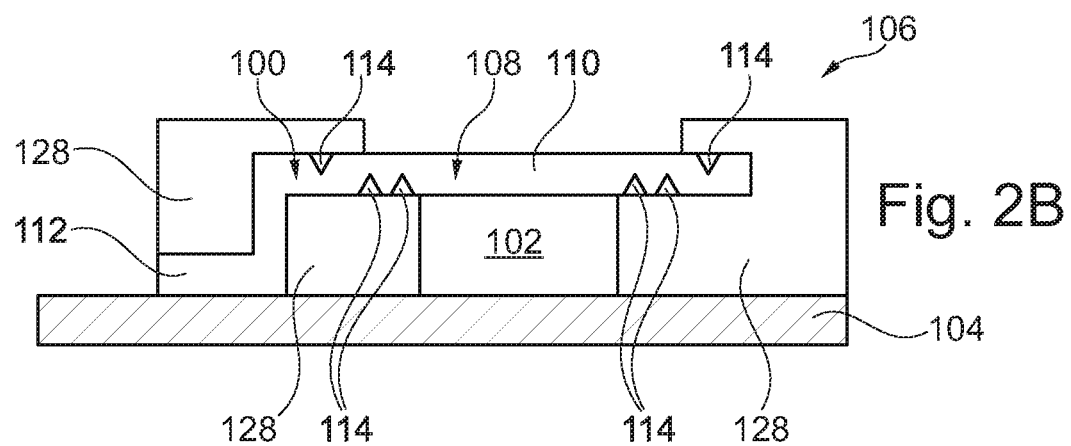
FIG. 2B illustrates a cross-sectional view of a package according to another exemplary embodiment.

FIG. 2B illustrates a cross-sectional view of a package 106 according to another exemplary embodiment.

The embodiment of FIG. 2B differs from the embodiment according to FIG. 2A in particular in that, according to FIG. 2B, further locking recesses 114 are formed in a surface portion of the clip body 108 facing away from the carrier 104. This may further promote interlocking between clip 100 and encapsulant 128.

A further difference of the embodiment of FIG. 2B compared to the embodiment of FIG. 2A is that, according to FIG. 2B, the clip 100 is overmolded in a vertical direction by the encapsulant 128 so that at least a part of the upper main surface of the clip 100 is not exposed with regard to the encapsulant 128 in the illustrated embodiment.

Figure 3:
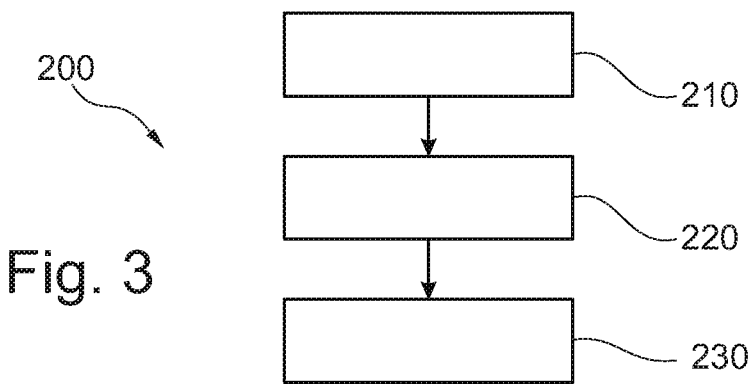
FIG. 3 illustrates a block diagram of a method of manufacturing a package according to an exemplary embodiment.

FIG. 3 illustrates a block diagram 200 of a method of manufacturing a package 106 according to an exemplary embodiment.

As illustrated by block 210, the method comprises connecting an electronic component 102 with a carrier 104 by a clip 100, the latter having at least one locking recess 114. Block 220 shows that the method further comprises partially encapsulating the clip 100 by an encapsulant 128 so that an upper main surface of the clip 100 remains partially exposed with regard to the encapsulant 128. Beyond this, as shown in block 230, the method comprises locking the encapsulant 128 and the clip 100 by accommodating material of the encapsulant 128 in the at least one locking recess 114.

Figure 4:
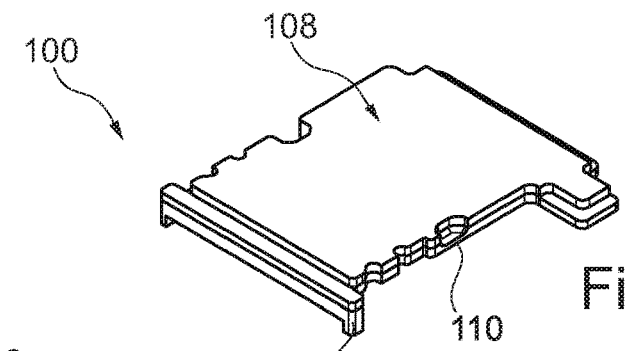
FIG. 4 to FIG. 8 illustrate different views of a clip according to an exemplary embodiment.
Figure 5:
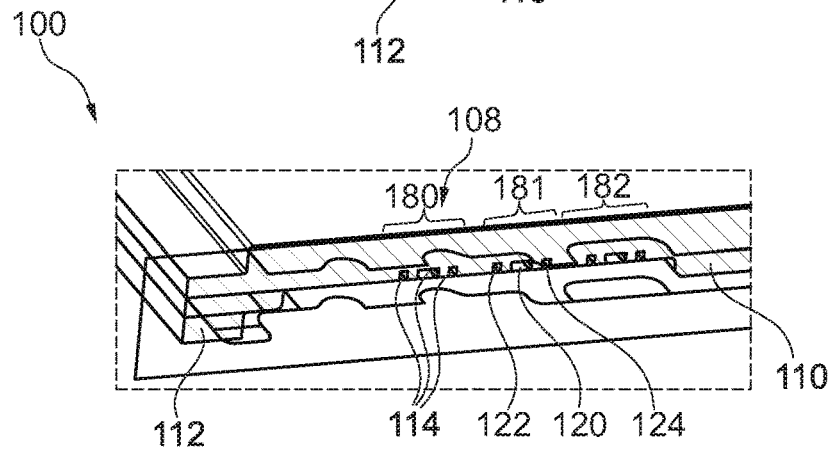
Figure 6:
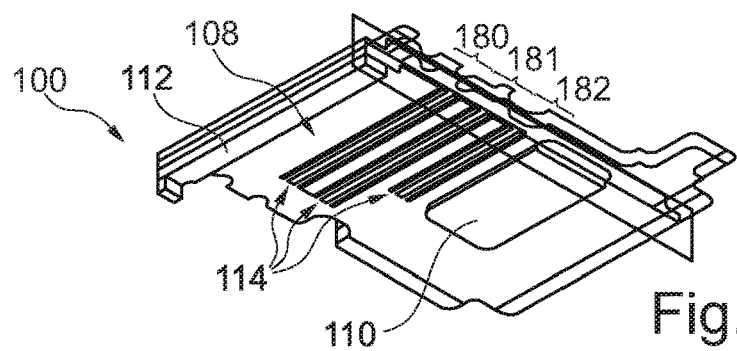
Figure 7:
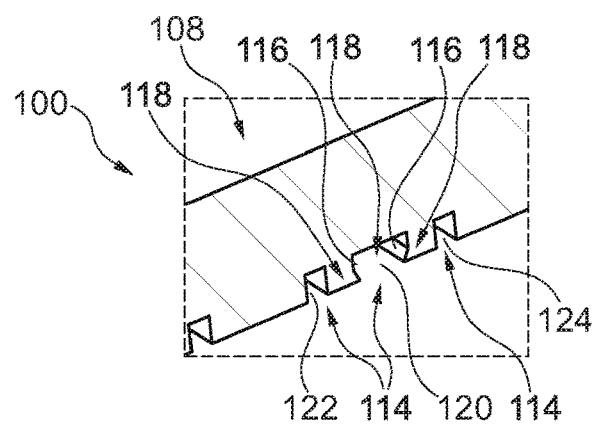
Figure 8:
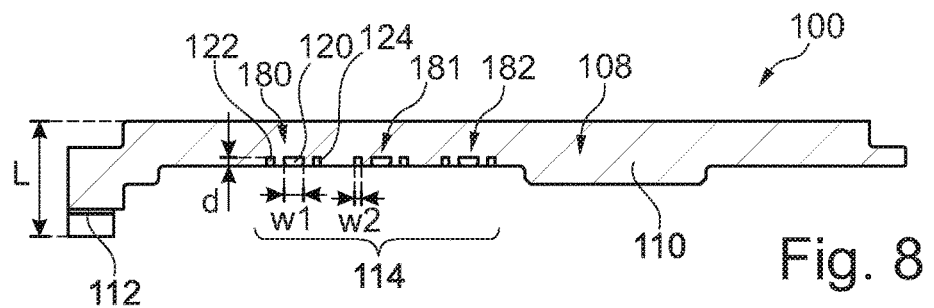

FIG. 4 to FIG. 8 illustrate different views of a clip 100 according to an exemplary embodiment: FIG. 4 shows a three-dimensional top view of clip 100. FIG. 5 shows a detailed view of a part of the clip 100. FIG. 6 shows a bottom view of clip 100. FIG. 7 illustrates a detailed view of part of a groove portion of clip 100. FIG. 8 shows a cross-sectional view of clip 100.

The illustrated clip 100 is configured for connecting an electronic component 102 (compare for example FIG. 2A, for instance a semiconductor chip, in particular a power semiconductor chip) with a carrier 104 (compare for example FIG. 2A, for example a leadframe) in a package 106. The clip 100 comprises a three-dimensionally curved clip body 108. Clip body 108 may be an integral body which may for instance be made of a homogeneous metallic material such as copper and/or aluminum. Optionally, one or more surface portions of the clip 100 may already be provided with solder or sinter material for accomplishing connection with electronic component 102 and/or carrier 104.

In accordance with the function of clip 100, clip body 108 has a component connection portion 110 configured for connecting an upper main surface of the electronic component 102 when mounted with its lower main surface on the carrier 104. Furthermore, clip body 108 has a carrier connection portion 112 configured for connecting an upper main surface of the carrier 104. More specifically, a lower main surface of carrier connection portion 112 may be attached to an upper main surface of carrier 104, in particular a lead of carrier 104 (compare reference numeral 176 in FIG. 10 and FIG. 18).

The cooperating main surfaces of carrier connection portion 112 and carrier 104 may be connected (in particular electrically coupled), for instance by soldering. Moreover, the cooperating main surfaces of component connection portion 110 and component 102 may also be connected (in particular electrically coupled), for instance by soldering. Beyond this, the cooperating main surfaces of carrier 104 and component 102 may also be connected (in particular electrically coupled), for instance by soldering.

As shown, the component connection portion 110 and the carrier connection portion 112 may be electrically coupled with each other as integral parts of carrier body 108. For instance, carrier body 108 may be a punched and bent portion of a metal plate such as a copper sheet processed for manufacturing clip 100.

As best seen in FIG. 5 to FIG. 7, the lower main surface of the clip 100 comprises multiple locking recesses 114. Thus, the illustrated locking recesses 114 are provided in a surface portion of the clip body 108 which are configured to face towards the carrier 104 in the readily manufactured package 106. As best seen in FIG. 6, the locking recesses 114 are formed in a lower surface portion of the clip body 108 between component connection portion 110 and carrier connection portion 112. As a result, the locking recesses 114 remain exposed and are not covered neither by the electronic component 102 when connected to component connection portion 110, nor by carrier 104 when connected with carrier connection portion 112. Consequently, when a still uncured encapsulant material (for instance still flowable, liquid or viscous) is provided, said uncured encapsulant 128 will flow into locking recesses 114. After curing (in particular solidification) of the encapsulant material, the solid encapsulant 128 (compare FIG. 2A) will remain permanently within locking recesses 114 to thereby establish an interlocking between encapsulant 128 and clip 100. Thus, the locking recesses 114 are configured for accommodating material of encapsulant 128 of package 106 to thereby lock the encapsulant 128 and the clip 100 together.

As shown in FIG. 4 to FIG. 8, all locking recesses 114 are formed in a surface portion of the clip body 108 facing towards the carrier 104 in the readily manufactured package 106. It has turned out that in particular the provision of locking recesses 114 in the lower main surface of the clip 100 has a highly positive impact on the intra-package adhesion, in particular between encapsulant 128 and clip 100 via locking recesses 114. Furthermore, maintaining the upper main surface of the clip 100 free from locking recesses 114 ensures that the upper main surface of clip 100 may largely remain exposed to an environment after encapsulation (compare FIG. 2A and FIG. 11). This, in turn, may additionally promote heat removal also via an exposed upper main surface of clip 100. Moreover, one or more locking recesses 114 in the lower main surface of clip body 108 have turned out as being particularly efficient for promoting adhesion between clip 100 and encapsulant 128.

However, although not shown in the figures, it is also possible to provide one or more locking recesses 114 in the upper main surface of the clip body 108, additionally or alternatively to the provision of one or more locking recesses 114 in the lower main surface thereof. In particular, such one or more further locking recesses 114 in the upper main surface of the clip 100 may be provided in a surface portion of the clip 108 being encapsulated in the package 106. Thus, it may be possible that also such additional one or more locking recesses 114 may contribute to a mechanical interlocking with material of encapsulant 128.

As best seen in FIG. 7, at least part of the locking recesses 114 may be provided with an undercut 116. In the shown embodiment, central recess 120 is provided with undercut 116. It has turned out that the provision of such an undercut 116 may be particularly efficient for creating a strong clip-encapsulant locking after solidifying previously flowable encapsulant material. Such an undercut 116 can also be advantageously used for forming dovetail shaped locking recesses 114 and/or dovetail shaped material portions of clip 100 in between. In particular, a locking recess 114 with undercut 116 may be formed with sidewalls having at least a section tapering towards an exterior of the locking recess 114.

As already mentioned, locking recesses 114 and/or material of the clip body 108 between adjacent locking recesses 114 may have a dovetail shape 118. As a result, a series of pins formed by material of the clip body 108 or of encapsulant 128 interlock with a series of tails formed by material of encapsulant 128 or of clip body 108 to thereby establish a form closure involving a pronounced undercut 116. The pins and tails may for instance have a trapezoidal shape or a hexagonal shape.

As can be seen best in FIG. 6, the locking recesses 114 are configured as parallel locking grooves. As shown, the locking grooves are oblong narrow hollow spaces formed as straight channels in the surface of the clip body 108.

Referring to FIG. 5 and FIG. 6, the illustrated locking recesses 114 are grouped into groups or sets 180, 181 and 182 of locking recesses 114. Each set 180, 181 and 182 corresponds to an assigned dimension of an electronic component 104 to be connected using one and the same clip 100. Thus, the illustrated clip 100 is a multipurpose clip usable for electronic components 104 (for instance different power semiconductor chips) of different sizes. Thus, clip 100 may serve as a universal clip for different die sizes, in particular each recess array of three grooved type locking recesses 114 corresponding to one assigned chip size.

For instance, each of the sets 180, 181 and 182 of locking recesses 114 assigned to a respective component dimension may be composed of a central recess 120 between two lateral recesses 122, 124 (compare FIG. 5 to FIG. 8). As shown, the central recess 120 may be wider than the two narrower lateral recesses 122, 124. Furthermore, the central recess 120 has side walls with tapering sections and straight sections, whereas the two narrower lateral recesses 122, 124 have fully straight side walls.

Thus, the embodiment of FIG. 4 to FIG. 8 shows a clip 100 with three sets 180, 181 and 182 of (partially dovetail shaped) locking grooves 114 to achieve correspondence with different die sizes. Although not shown, it is additionally or alternatively possible to provide one or more groove sets also on top of clip 100 to further improve adhesion between clip 100 and encapsulant 128.

Now specifically referring to FIG. 8, a depth d of the locking recesses 114 may for instance be 50 μm. A width w1 of the central recesses 120 may for instance be 80 μm, whereas a width w2 of the lateral recesses 122, 124 may be 50 μm. A thickness L of the clip body 108 can be for instance 400 μm.

The locking recesses 114 may be formed for example by punching or etching into a planar lower main surface portion of clip body 108. In terms of manufacturing locking grooves 114, it is in particular possible to punch V-shaped groove to create the describe advantageous dovetail effect. More specifically, the lateral recesses 122, 124 may be formed by a vertical punching process. The central recesses 120 may be formed by side punching.

Advantageously, the locking recesses 114 positioned and shaped as illustrated in FIG. 4 to FIG. 8 may promote mechanical interlocking between clip 100 and encapsulant 128. However, the locking recesses 114 also function as surface tensioner so that not only encapsulant material, but optionally also solder material may flow into at least part of said locking recesses 114. By corresponding positioning the locking recesses 114, they may synergistically also prevent or at least suppress undesired flow of solder material into undesired regions of the package 106.

Figure 9:
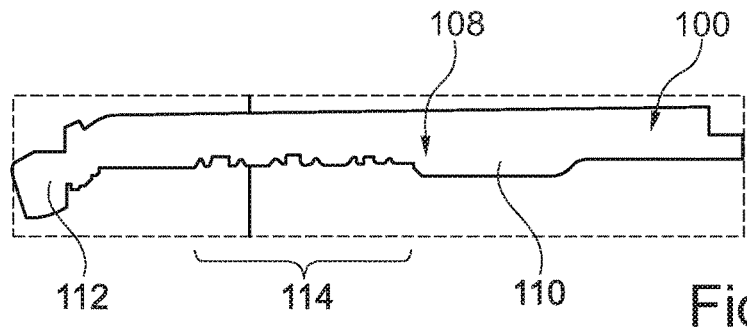
FIG. 9 illustrates a cross-sectional view of a manufactured clip according to an exemplary embodiment.

FIG. 9 illustrates a cross-sectional view of a manufactured clip 100 according to an exemplary embodiment. Thus, FIG. 9 shows an actual clip image captured by an X-ray camera.

Figure 10:
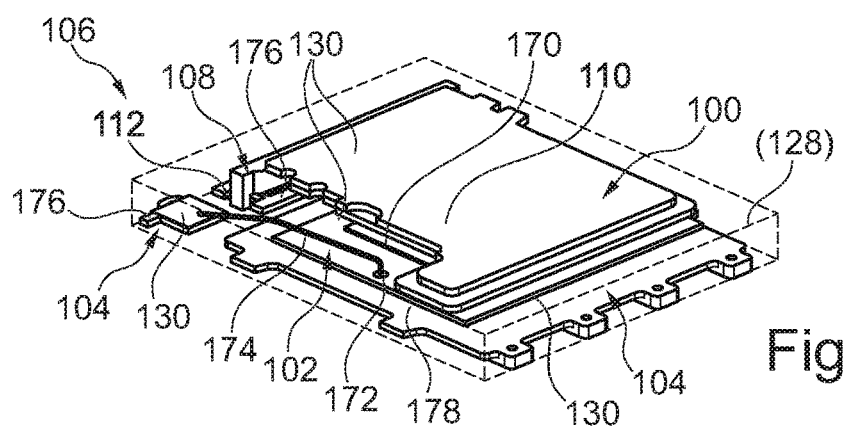
FIG. 10 to FIG. 12 illustrate different views of a package according to another exemplary embodiment.
Figure 11:
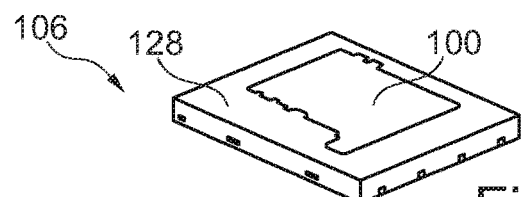
Figure 12:
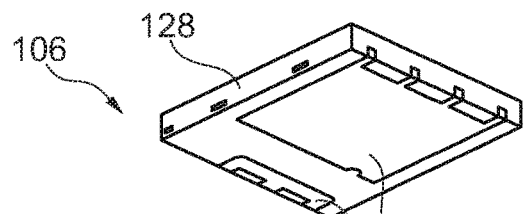

FIG. 10 to FIG. 12 illustrate different views of a package 106 according to another exemplary embodiment. More specifically, FIG. 10 illustrates package 106 without mold type encapsulant 128. FIG. 11 shows a top view of encapsulated package 106. FIG. 12 shows a bottom view of encapsulated package 106.

The package 106 comprises a clip 100 with locking recesses 114, as the one shown in FIG. 4 to FIG. 8, for connecting a semiconductor chip type electronic component 102 with a leadframe type carrier 104. As described below in further detail, carrier 104 of the shown embodiment is composed of three separate carrier bodies.

A mold type encapsulant 128 partially encapsulates the electronic component 102, partially encapsulates the carrier 104 and partially encapsulates the clip 100. However, an upper main surface of the clip 100 remains partially exposed with regard to the encapsulant 128, as shown in FIG. 11. Furthermore, a lower main surface of the carrier 104 also remains partially exposed with regard to the encapsulant 128, compare FIG. 12. As a result, package 106 is configured for double-sided cooling, wherein the exposed copper surfaces of clip 100 and carrier 104 significantly contribute to heat removal.

Material of the encapsulant 128 is accommodated in the locking recesses 114 to thereby mechanically lock the encapsulant 128 and the clip 100. Consequently, delamination of the constituents of package 106 is efficiently suppressed and the mechanical integrity of the package 106 is enhanced. This has a positive impact on both mechanical and electrical reliability of package 106. According to FIG. 10 to FIG. 12, the locking recesses 114 may be formed in a surface portion of the clip body 108 facing towards the carrier 104 (as in FIG. 4 to FIG. 8).

In the shown embodiment, the electronic component 102 is a transistor type power semiconductor chip. The electronic component 102 has a top side with a source pad 170 on which the component connection portion 110 of clip body 108 is mounted. On the top side of the electronic component 102, a gate pad 172 is formed as well which is electrically coupled with a lead 176 of carrier 104 by a bond wire 174 (for instance a gold wire, or any other interconnect structure such as a bond ribbon or a further clip). The electronic component 102 has a bottom side with a drain pad (not shown) which is mounted on a die pad 178 of carrier 104. In the shown embodiment, the electronic component 102 experiences a vertical current flow during operation.

The electronic component 102 is mounted on the carrier 104 by a connection medium 130, such as solder, which may be partially accommodated in at least one of the locking recesses 114 so that solder flow into undesired portions of the package 106 may be suppressed. Furthermore, a connection medium 130, such as solder, may be also provided between component 102 and clip 100, between lead 176 and bond wire 174, between bond wire 174 and component 102, and/or on top of clip 100.

For instance, the illustrated package 106 may be a PQFN type package, for instance having dimensions of 5.0 mm×6.0 mm×0.65 mm.

Figure 13:
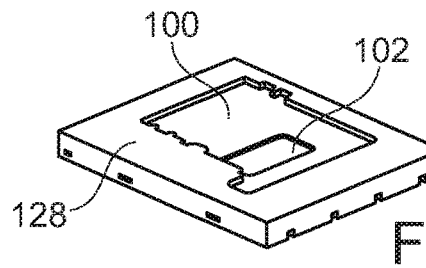
FIG. 13 to FIG. 18 illustrate different constituents of the package according to FIG. 10 to FIG. 12.

FIG. 13 to FIG. 18 illustrate different constituents of the package 106 according to FIG. 10 to FIG. 12. In the following, these various constituent of package 106 will be explained referring to FIG. 13 to FIG. 18:

Referring to FIG. 13, encapsulant 128 is shown which may be a mold compound. Encapsulant 128 encapsulates, inter alia, clip 100 and electronic component 102.

Figure 14:
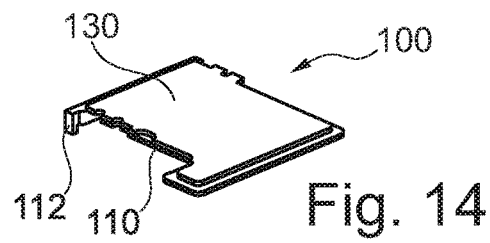

Referring to FIG. 14, clip 100 is illustrated which may be optionally plated on top thereof for instance with a connection medium 130, for instance may be CuSn plated. Clip 100 may have a thickness of for the example 0.385 mm.

Figure 15:
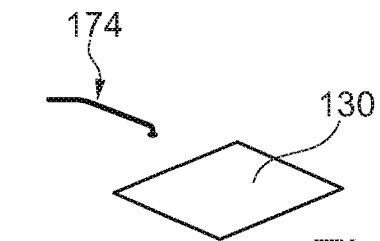

Referring to FIG. 15, bond wire 174 is shown together with connection medium 130 on top of electronic component 102. For example, the bond wire 174 may be made of Au-4N and may have a filament thickness of 33 µm. Connection medium 130, functioning as top solder, may be embodied as PbSnAg.

Figure 16:
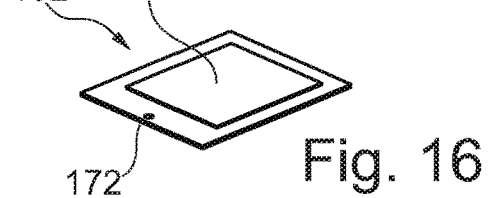

Referring to FIG. 16, and upper side of MOSFET type electronic component 102 is shown, illustrating source pad 170 and gate pad 172. Drain pad (not shown) is provided on the lower side of electronic component 102.

Figure 17:
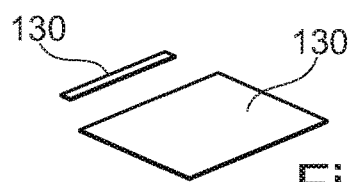

Referring to FIG. 17, connection medium 130, being here embodied as bottom solder, is shown which may be applied to the upper main service of carrier 104. Connection medium 130, functioning as bottom solder, may be embodied as PbSnAg.

Figure 18:
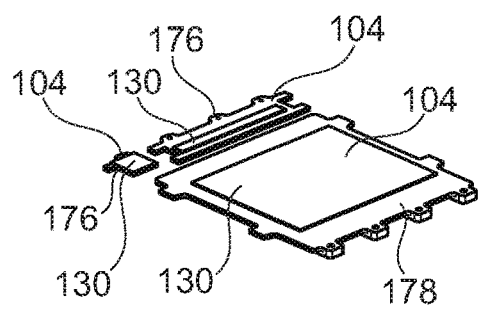

Referring to FIG. 18, leadframe type carrier 104 is shown which is composed of die pad 178 and two leads 176 which may all be covered with a solder type connection medium 130. The carrier 104 may be made of copper, provided with a selective silver plating, etc.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A clip for connecting an electronic component with a carrier in a package, the clip comprising:
    a clip body comprising:
        a component connection portion configured to be connected with the electronic component to be mounted on the carrier; and
        a carrier connection portion configured to be connected with the carrier;
        a first surface portion configured to face the carrier;
        a second surface portion configured to face away from the carrier; and
        a plurality of parallel locking grooves formed only in the first surface portion of the clip body in a region of the clip body interposed between the component connection portion and the carrier connection portion,
    wherein the plurality of parallel locking grooves is configured to accommodate material of an encapsulant of the package so as to lock the encapsulant and the clip.

2. The clip of claim 1, further comprising at least one further locking groove formed only in the second surface portion of the clip body.

3. The clip of claim 1, wherein at least part of at least one of the plurality of parallel locking grooves has an undercut.

4. The clip of claim 1, wherein at least one of the plurality of parallel locking grooves and/or material of the clip body between two adjacent locking ones of the locking grooves has a dovetail shape.

5. The clip of claim 1, wherein the plurality of parallel locking grooves is formed as a groove array comprising a central groove between two other grooves of the groove array.

6. The clip of claim 5, wherein the central groove has a larger width than each of the two other grooves of the groove array.

7. The clip of claim 5, wherein the central groove has at least partially tapering side walls, and wherein the two other grooves of the groove array have straight side walls.

8. The clip of claim 1, wherein at least one of a depth and a width of the plurality of parallel locking grooves is in a range between 20 µm and 200 µm.

9. The clip of claim 1, wherein a thickness of the clip body is in a range between 200 µm and 1 mm.

10. The clip of claim 1, wherein the plurality of parallel locking grooves comprises a central groove between two other grooves of the groove array, and wherein at least part of the central groove has an undercut.

11. The clip of claim 1, wherein the plurality of parallel locking grooves is grouped into sets of locking grooves, and wherein each of the sets of locking grooves corresponds to an assigned dimension of a different electronic component such that the clip is a multipurpose clip usable for electronic components of different sizes.

12. The clip of claim 11, wherein each of the sets of locking grooves has three parallel locking grooves that correspond to one assigned chip size.

13. The clip of claim 11, wherein each of the sets of locking grooves has a central locking groove between two lateral locking grooves.

14. The clip of claim 13, wherein the central locking groove is wider than the two lateral locking grooves.

15. The clip of claim 13, wherein the central locking groove has side walls with tapering sections and straight sections, and wherein the two lateral locking grooves have fully straight side walls.

16. A package, comprising:
- a clip configured to connect an electronic component with a carrier and having a plurality of parallel locking grooves in a region of the clip interposed between a component connection portion of the clip configured to be connected with the electronic component to be mounted on the carrier and a carrier connection portion of the clip configured to be connected with the carrier; and
- an encapsulant partially encapsulating the clip so that the clip remains partially exposed with respect to the encapsulant,
- wherein material of the encapsulant is accommodated in the plurality of parallel locking grooves so as to lock the encapsulant and the clip,
- wherein the plurality of parallel locking grooves is formed only in a surface portion of the clip configured to face towards the carrier.

17. The package of claim 16, further comprising at least one further locking groove formed only in a surface portion of the clip configured to face away from the carrier.

18. The package of claim 16, wherein the package further comprises the electronic component, and wherein the electronic component is at least partially encapsulated in the encapsulant and connected with a component connection portion of the clip.

19. The package of claim 18, wherein the package further comprises the carrier on which the electronic component is mounted, and wherein the carrier is partially encapsulated in the encapsulant and connected with a carrier connection portion of the clip.

20. The package of claim 18, wherein at least one connection selected from the group consisting of a connection between the electronic component and the carrier, a connection between the electronic component and the clip, and a connection between the carrier and the clip, is formed by a connection medium.

21. The package of claim 20, wherein the connection medium is accommodated in the plurality of parallel locking grooves, and wherein the connection medium is selected from the group consisting of a solder structure, a sinter structure, a welding structure, and a glue structure.

* * * * *